US008692195B2

(12) United States Patent
Ito et al.

(10) Patent No.: US 8,692,195 B2
(45) Date of Patent: *Apr. 8, 2014

(54) CHARGED PARTICLE RADIATION DEVICE

(71) Applicant: Hitachi High-Technologies Corporation, Tokyo (JP)

(72) Inventors: Sukehiro Ito, Hitachinaka (JP); Junichi Katane, Naka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/633,476

(22) Filed: Oct. 2, 2012

(65) Prior Publication Data

US 2013/0026363 A1    Jan. 31, 2013

Related U.S. Application Data

(63) Continuation of application No. 13/147,980, filed as application No. PCT/JP2010/000279 on Jan. 20, 2010, now Pat. No. 8,294,097.

(30) Foreign Application Priority Data

Feb. 6, 2009    (JP) ................................. 2009-025495

(51) Int. Cl.
  *H01J 37/28*    (2006.01)
  *H01J 37/26*    (2006.01)
  *G01N 23/225*    (2006.01)
(52) U.S. Cl.
  USPC ........... 250/310; 250/306; 250/311; 250/397; 250/399; 250/396 R
(58) Field of Classification Search
  USPC .............. 250/310, 306, 311, 397, 399, 396 R
  See application file for complete search history.

(56) References Cited

U.S. PATENT DOCUMENTS

| 4,785,182 A | 11/1988 | Mancuso et al. |
| 6,679,822 B2 | 1/2004 | Kubo et al. |

(Continued)

FOREIGN PATENT DOCUMENTS

| JP | 2001-126655 A | 5/2001 |
| JP | 2003-157789 A | 5/2003 |

(Continued)

OTHER PUBLICATIONS

Gerhard Herzberg, F.R.S.C., "Molecular Spectra and Molecular Structure," D. Van Nostrand Company, Inc.

(Continued)

*Primary Examiner* — Nikita Wells
(74) *Attorney, Agent, or Firm* — McDermott Will & Emery LLP

(57) ABSTRACT

The present invention provides a scanning charged particle beam device including a sample chamber (8) and a detector. The detector has: a function of detecting light at least ranging from the vacuum ultraviolet region to the visible light region, of light (17) having image information which is obtained by a light emission phenomenon of gas scintillation when the sample chamber is controlled to a low vacuum (1 Pa to 3,000 Pa); and a function of detecting ion currents (11, 13) having image information which are obtained by cascade amplification of electrons and gas molecules. Accordingly, it becomes possible to realize a device which can deal with observation of various samples. Further, an optimal configuration of the detection unit is devised, to thereby make it possible to add value to an obtained image and provide users in wide-ranging fields with the observation image. In addition, the detector is made usable in combination with a detector for high vacuum, to thereby make it possible to provide wide-ranging users with the image, irrespective of the vacuum mode.

16 Claims, 12 Drawing Sheets

(56) References Cited

U.S. PATENT DOCUMENTS

| | | | |
|---|---|---|---|
| 6,781,124 B2 | 8/2004 | Hayn | |
| 7,193,222 B2 | 3/2007 | Jacka et al. | |
| 7,276,693 B2 * | 10/2007 | Koyama et al. | 250/310 |
| 7,462,839 B2 * | 12/2008 | Gnauck et al. | 250/397 |
| 7,511,271 B2 | 3/2009 | Hatano et al. | |
| 7,755,045 B2 * | 7/2010 | Hatano et al. | 250/310 |
| 8,294,097 B2 * | 10/2012 | Katane et al. | 250/310 |
| 2003/0010913 A1 | 1/2003 | Essers | |
| 2005/0173644 A1 | 8/2005 | Gnauck et al. | |
| 2006/0186337 A1 | 8/2006 | Hatano et al. | |
| 2010/0090109 A1 | 4/2010 | Hatano et al. | |
| 2012/0112062 A1 | 5/2012 | Novak et al. | |

FOREIGN PATENT DOCUMENTS

| | | | |
|---|---|---|---|
| JP | 2003-515907 A | 5/2003 |
| JP | 2004-503062 A | 1/2004 |
| JP | 2006-228586 A | 8/2006 |

OTHER PUBLICATIONS

Entire Prosecution of U.S. Appl. No. 13/147,980, to Junichi Katane et al., filed Aug. 4, 2011, entitled "Charged Particle Radiation Device".

* cited by examiner

CHARGED PARTICLE RADIATION DEVICE

RELATED APPLICATIONS

This application is a Continuation of U.S. application Ser. No. 13/147,980, filed on Aug. 4, 2011, which is the U.S. National Phase under 35 U.S.C. §371 of International Application No. PCT/JP2010/000279, filed on Jan. 20, 2010, which in turn claims the benefit of Japanese Application No. 2009-025495, filed on Feb. 6, 2009, the entire disclosures of which Applications are incorporated by reference herein.

TECHNICAL FIELD

The present invention relates to a charged particle beam device which uses a charged particle beam such as an electron beam and an ion beam, and more particularly, to a charged particle beam device which can realize: means for detecting light in a region at least ranging from the vacuum ultraviolet light region to the visible light region; and combination use of detection of light and ion current detection.

BACKGROUND ART

In a charged particle beam device typified by a scanning electron microscope, a sample is scanned with a finely focused charged particle beam, whereby desired information (for example, a sample image) is obtained from the sample.

In such a charged particle beam device, up to now, observation utilizing reflection electrons with relatively high energy has been the mainstream of an observation method for a low-vacuum (approximately 1 Pa to 3,000 Pa) region. This is because, when a large number of gas molecules existing under low vacuum and electrons having an image signal repeatedly collide against each other, the electrons having image information lose energy thereof in this detection process and thus cannot reach a detector, so that the observation utilizing electrons with higher energy, that is, reflection electrons has been considered as a method which enables easier observation. The type of a material of an observation sample, more specifically, an atomic number effect thereof remarkably appears on the obtained image, and hence this method is frequently utilized at present for, particularly, surface observation and analysis of the surface in the materials field. Moreover, a high scanning speed (TV-Scan and the like) can be sufficiently dealt with, irrespective of a high vacuum or a low vacuum, and this is one of the reasons why this method has been utilized mainly for a detector.

Meanwhile, in recent years, a detection method of utilizing secondary electrons with small electron energy has been actively studied. For example, Patent Literatures 1, 2, and 3 exist. According to a large part of the existing methods, an electrode is placed in advance above a sample, and cascade amplification is utilized in which secondary electrons generated from the sample are accelerated so as to repeatedly collide for amplification against gas molecules existing inside of a sample chamber.

Such a method is known as roughly two types of detection methods. One is an electron current detection method of detecting the amplified secondary electrons themselves, and the other is an ion detection method of detecting positive ions which are generated when the secondary electrons and the gas molecules collide against each other.

As representative examples of the conventional technologies, Patent Literature 1 can be cited for the electron current method, and Patent Literatures 2 and 3 can be cited for the ion current method.

Both of the images obtained according to the two methods closely resemble a high-vacuum secondary electron image because a basic signal source is the secondary electrons from the observation sample, and it is possible to obtain an image having properties different from those of a reflection electron image, that is, an image having information on an extreme surface of the observation sample.

CITATION LIST

Patent Literature

Patent Literature 1: U.S. Pat. No. 4,785,182
Patent Literature 2: JP Patent Publication (Kokai) No. 2001-126655 A
Patent Literature 3: JP Patent Publication (Kokai) No. 2006-228586 A
Patent Literature 4: JP Patent Publication (Kokai) No. 2003-515907 A
Patent Literature 5: JP Patent Publication (Kokai) No. 2004-503062 A
Patent Literature 6: U.S. Pat. No. 6,781,124 B2
Patent Literature 7: U.S. Pat. No. 7,193,222 B2
Patent Literature 8: U.S. Pat. No. 6,979,822 B1

Non Patent Literature

Non Patent Literature 1: Molecular Spectra and Molecular Structure D. Van Nostrand Company, Inc.

SUMMARY OF INVENTION

Technical Problem

On the other hand, unlike the high-vacuum secondary electron image and the reflection electron image, there is a technical difficulty in terms of performance, that is, a difficulty in observation at a high scanning speed. A conceivable reason therefor is that the ions having a relatively low flowing speed serve, in the cascade amplification process of the electrons and the ions, as an intermediary for the electrons which form an image, and hence a difference occurs between an image to be observed finally and the scanning speed of a primary electron beam. That is, there is a physical limitation of the detection speed.

Particularly in recent years, the need for an image obtained under low vacuum is directed to acquisition of an extreme surface image of an observation sample and secondary electron observation having quality which is high enough to be comparable to the high-vacuum secondary electron image. In addition, fields which require such secondary electron observation under low vacuum widely range over a biological/chemical materials field, a geological field, a semiconductor field, and the like.

Therefore, according to the present invention, detection means which uses light as a signal source instead of electrons and ions, which have been conventionally used for detection, has been studied as the method for observing an extreme surface of a sample under low vacuum.

A detection method and an image observation method utilizing this detection means are disclosed as conventional technologies in Patent Literatures 4 and 5 and Patent Literatures 6, 7, and 8 similar thereto.

When high energy is given to electrons, gas molecules, and ions which are in a discharge state (including a plasma state), the electrons, the gas molecules, and the ions make the transition of an energy level from the ground state to the excited state, and return to the ground state after a short time (are kept in the excited state for several ns, and then returns shortly). At the time of returning to the ground state, the electrons, the gas molecules, and the ions emit photons corresponding to the energy at the transition. This light is light having a spectrum specific to, particularly, the type of gas, that is, an atom or a molecule. In the case of a detection method utilizing this light emission phenomenon (gas scintillation), as a matter of course, the light is detected. Accordingly, even a high scanning speed is dealt with at a sufficient response speed, and the obtained image closely resembles the high-vacuum secondary electron image.

Studying the above-mentioned literatures, there is not any description of the type of light which is generated by the light emission phenomenon of the gas scintillation, and contents thereof do not fulfill further enhancement in performance and discovery of an added value.

In the case of utilizing this phenomenon, what is particularly important is that a way of approaching optimization is different depending on what type of light is handled.

The spectrum of light emission occurring under vacuum depends on the type of introduced gas. The inventors of the present invention found out that the wavelength of the light of this type is different from the wavelength of light emission (the vicinity of about 420 nm) of a scintillator normally used in an SEM, and spreads up to a vacuum ultraviolet region with a further shorter wavelength.

Because the wavelength of the light spreads up to the vacuum ultraviolet region, it is considered that the technologies as disclosed in Patent Literatures 4 and 5 have a limitation in effective detection. This is because, in the detector which uses the light normally used in the SEM as described above, a material of a light guide and a photomultiplier tube are selected so as to suit the emission spectrum of the scintillator, and hence at least the transmittance of the light guide and the light-photoelectron conversion rate of the photomultiplier tube significantly decrease with regard to other wavelengths (see FIG. 4 and FIG. 5).

One object of the present invention is to provide an efficient detection method of using light under low vacuum as a detection signal source.

Further, in addition to the above-mentioned object, combination use of detection of light and ion current detection has been studied.

For an approach thereto, in consideration of the properties of light described above, the structure itself of the conventional detection method, particularly, the ion current detection is relatively simple, and hence means in which the method of detecting light having image information and the ion current detection are combined with each other is realizable enough.

As a result of an experiment, a difference in image quality could be confirmed between: image quality obtained by the ion current detection of the conventional detection method; and image quality obtained by detecting the light having the image information. Both are images which are considerably close to the high-vacuum secondary electron image, but a difference in contrast can be obtained therebetween depending on the type of a sample to be observed. Accordingly, such a difference in image quality is considerably useful, and it is suggested that observation of various samples can be dealt with. This means that the above-mentioned means is useful to users in wide-ranging different fields in addition to users in fields covered by the conventional technologies.

As a matter of course, in the case of handling the light having the image information, a response speed sufficient to deal with high-speed scanning such as TV-Scan can be obtained.

In view of the above, a further object of the present invention is to bring out, to the maximum, performance and functions of each of the detection method of using light as a detection signal source and the detection method of using ions as a detection signal source and thus devise an optimal configuration of a detection unit, to thereby add value to an obtained image and provide users in wide-ranging fields with the observation image.

Solution to Problem

According to the experiment on which the present invention is based, although the wavelength of emitted light contained light in the visible region, the wavelength thereof contained, as expected, a large amount of light ranging from the vacuum ultraviolet region to the visible region. Therefore, in the present invention, properties of light to be handled are sufficiently considered, so that a configuration capable of detection from the vacuum ultraviolet region to the visible region is adopted.

In view of the above, in the present invention, a detection unit which detects light includes a light guide (optical waveguide) made of a material which can transmit therethrough light at least ranging from the vacuum ultraviolet light region to the visible light region.

In addition, for the combination use of detection of light and ion detection, a sample chamber controlled to a low vacuum (1 Pa to 3,000 Pa) is provided, and the detector includes: a control unit which includes a positive electrode in which +300 to +500 V is applied to at least one electrode, detects light having image information by means of a light guide (optical waveguide) disposed in a vicinity of the positive electrode, converts and amplifies the light into photoelectrons by means of a photomultiplier tube coupled to the light guide, and then forms an image; and a control unit which detects, as a current signal, an ion current having image information from another electrode having a potential different from that of the electrode, and forms an image.

Advantageous Effects of Invention

According to the present invention, it becomes possible to bring out, to the maximum, performance and functions of each of the detection method of using light under low vacuum as a detection signal source and the detection method of using ions as a detection signal source, which is a conventional technology, and thus devise an optimal configuration of a detection unit, to thereby add value to an obtained image and provide users in wide-ranging fields with the observation image.

DESCRIPTION OF EMBODIMENTS

Hereinafter, some representative embodiments of the present invention are described with reference to the drawings.

Embodiment 1

In the present embodiment, with regard to a scanning electron microscope which detects light having image information, an embodiment relating to a detector is described, the detector including: a detection unit which detects light having image information which is obtained by a light emission phenomenon of gas scintillation which occurs in an observation sample chamber controlled to a low vacuum (for example, 1 Pa to 3,000 Pa); and a detection unit which detects an ion current having image information which is obtained by cascade amplification (gas amplification) of electrons and gas molecules.

Figure 1:
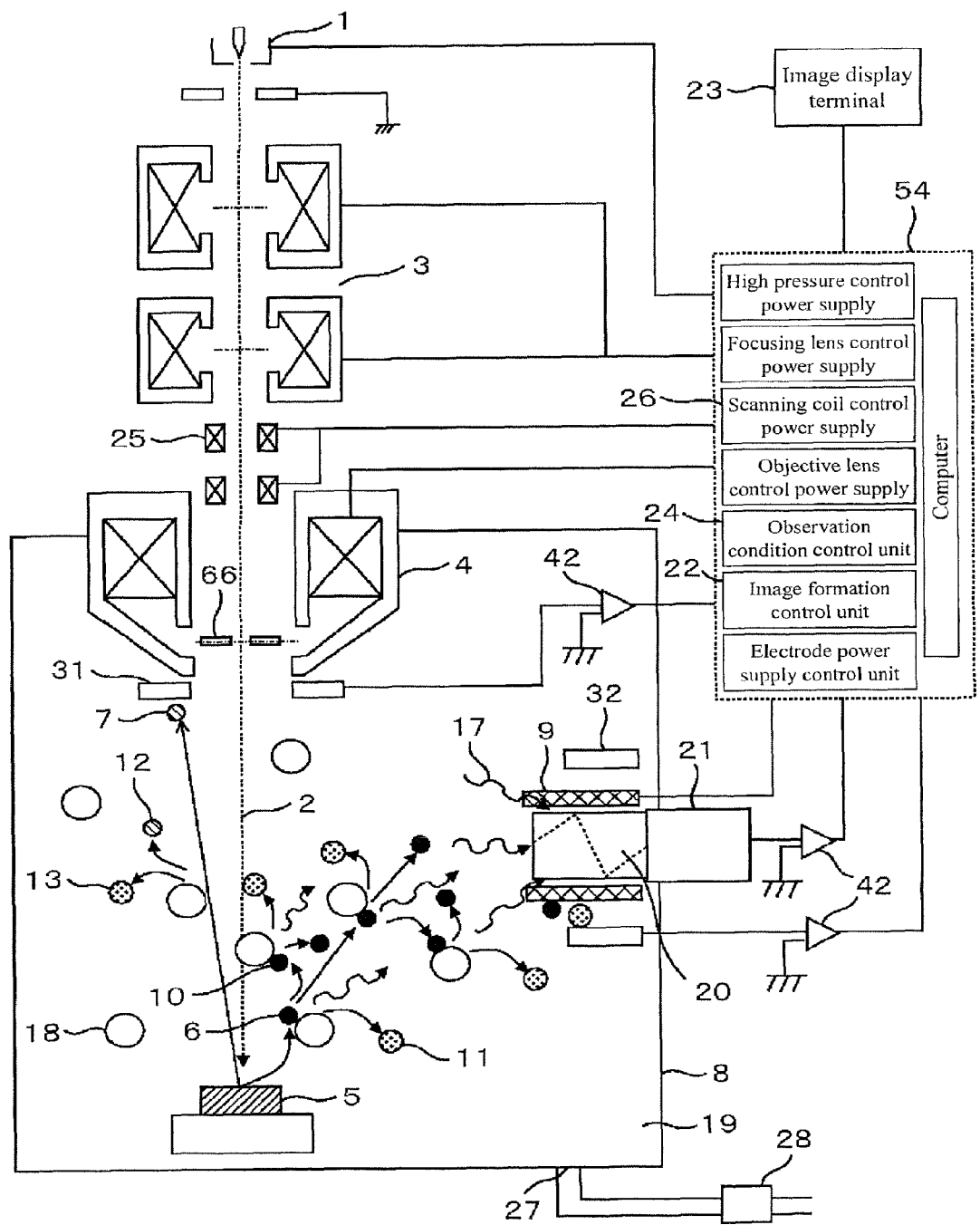
FIG. 1 is a schematic view of a scanning electron microscope which is one example of the present invention.

FIG. 1 is a configuration view schematically illustrating an external configuration of a scanning electron microscope in which a detector which is one example of the present invention is disposed.

The scanning electron microscope illustrated in FIG. 1 includes: an electron optical system including an objective lens 4; an observation sample chamber 8; a photomultiplier tube 21 which converts and amplifies light detected by a light guide 20 into photoelectrons; a control unit 22 which processes an outputted image signal to thereby form an image; similarly, a control unit 22 which processes a positive ion current signal derived from detected secondary electrons to thereby form an image; an image processing terminal 23 connected to the control units; and the like. The image processing terminal 23 includes: display means for displaying a formed image; information input means for inputting information necessary for an operation of a device into a GUI displayed on the display means; and the like. It should be noted that respective constituent elements of the electron optical system, for example, an acceleration voltage of a primary electron beam, a current and a voltage to be applied to each electrode, and the like are adjusted by an observation condition control unit 24 in an automatic manner or in accordance with a desired value which is inputted by a user on the image processing terminal 23.

An electron source 1 included in the scanning electron microscope emits a primary electron beam 2 of, generally, 0.3 kV to 30 kV. A multi-stage lens 3 is controlled into conditions suitable for observation, and has a function of converging the primary electron beam. The objective lens 4 similarly has a function of converging the primary electron beam so that the primary electron beam forms an image on a sample 5 to be observed and is focused on a point suitable for the observation. A deflector 25 moves for scanning an irradiation position of the primary electron beam on the sample 5 within a desired range of an observation field of view. In addition, a scanning speed can be changed by a deflection signal control unit 26 which controls the deflector 25. Along with the irradiation with the primary electron beam, secondary electrons 6 and reflection electrons 7 are emitted from the sample.

The degree of vacuum inside of the observation sample chamber 8 is controlled by opening/closing of a needle valve 28 for an atmosphere introduction port 27 to the observation sample chamber 8. This low-vacuum SEM is provided with not only an observation mode under low vacuum but also an observation mode under high vacuum, and at the time of observation under high vacuum, the needle valve 28 is closed, whereby the inside of the observation sample chamber 8 is kept in a high-vacuum state of $10^{-3}$ Pa or smaller. At this time, the secondary electrons 6 generated from the sample 5 are detected by a secondary electron detector for high vacuum. Normally, the secondary electron detector for high vacuum detects the secondary electrons 6 by means of a detector which is referred to as an Everhart Thornley detector 29 and includes a scintillator 55 and a photomultiplier tube. +10 kV 43 is applied to the vicinity of the scintillator, and further, in order to increase an efficiency of collecting the secondary electrons 6, a potential gradient is supplied to the inside of the observation sample chamber 8 by a secondary electron collector electrode 30 to which, typically, +300 V is applied.

The reflection electrons 7 are detected by a reflection electron detector 31 disposed immediately below the objective lens 4. A semiconductor detector or a micro-channel plate is used for the reflection electron detector 31. In the case of using the semiconductor detector, the reflection electron detection can be performed even in the observation mode under low vacuum to be descried later. Hereinafter, it is assumed that the reflection electron detector 31 is the semiconductor detector.

Signals derived from the detected secondary electrons and reflection electrons are electrically amplified, then are subjected to A/D conversion by the control unit 22, and are displayed on the image processing terminal 23 in synchronization with the scanning with the primary electron beam 2. As a result, an SEM image within the range of the observation field of view can be obtained.

At the time of the observation under low vacuum, the inside of the sample chamber 8 is kept at a given gas pressure 19 by opening/closing of the needle valve 28. In addition, the potential of the secondary electron collector electrode 30 is switched to the ground potential. The typical gas pressure 19 inside of the sample chamber is 1 to 300 Pa, but can be controlled up to 3,000 Pa in a special case.

Description is given below of a process of forming an image through the light emission phenomenon of the gas scintillation and the cascade amplification (gas amplification) of the electrons and the gas molecules, for the purpose of the observation under low vacuum.

(1) In the sample chamber 8 controlled to a low-vacuum atmosphere (1 Pa to 3,000 Pa), the secondary electrons 6 are generated from a sample 5 which is irradiated with the primary electron beam 2.
  (1)-1 Electrons and positive ions are generated by collision between primary electrons and neutral gas molecules inside of the sample chamber.
  (1)-2 The secondary electrons 6 are generated from the sample 5.
(2) The secondary electrons 6 generated from the sample 5 are attracted by a first electrode 9 (+300 V to +500 V) disposed above the sample, and repeatedly collide against the neutral gas molecules, so that the electrons and the positive ions are generated by the cascade amplification caused by an electron avalanche. Meanwhile, the reflection electrons have energy equal to that of the primary electrons, and collide against the neutral gas molecules similarly, so that the electrons and the positive ions are generated.
  (2)-1 Electrons 10 derived from the secondary electrons and positive ions 11 derived from the secondary electrons are amplified by the electron avalanche of the secondary electrons from the sample.
  (2)-2 Similarly, electrons 12 and positive ions 13 derived from the reflection electrons are generated.

A method of detecting the positive ion current in this stage, that is, the positive ions 11 derived from the secondary electrons and the positive ions 13 derived from the reflection electrons, to thereby acquire an image is referred to as an ion current detection method. Further, with regard to the light emission phenomenon of the gas scintillation, an image is acquired through the following process.

(3) Energy is given to the electrons and the neutral gas molecules from large energy in a plasma state (discharge) due to an electric field formed by the positive electrode above the sample, so that the transition is made from a ground state 14 to an excited state 15.
  (3)-1 The ground state 14 (stable atom/molecule state) to the excited state 15 (unstable atom/molecule state).
(4) At the time of return from the unstable excited state to the ground state, light having light energy corresponding to transition energy at the transition to the excited state, that is, light (ultraviolet light/visible light) 17 having image information is generated.
  (4)-1 Light having an emission wavelength peak which differs depending on the type of the neutral gas molecules 18 and the gas pressure 19 inside of the observation sample chamber 8 is generated.
(5) The light emitted in the above item (4) is detected directly by a surface of the light guide 20, the light is converted and amplified into electrons by the photomultiplier tube (PMT) 21, and then the image is observed via the formation control unit 22.

Figure 2:
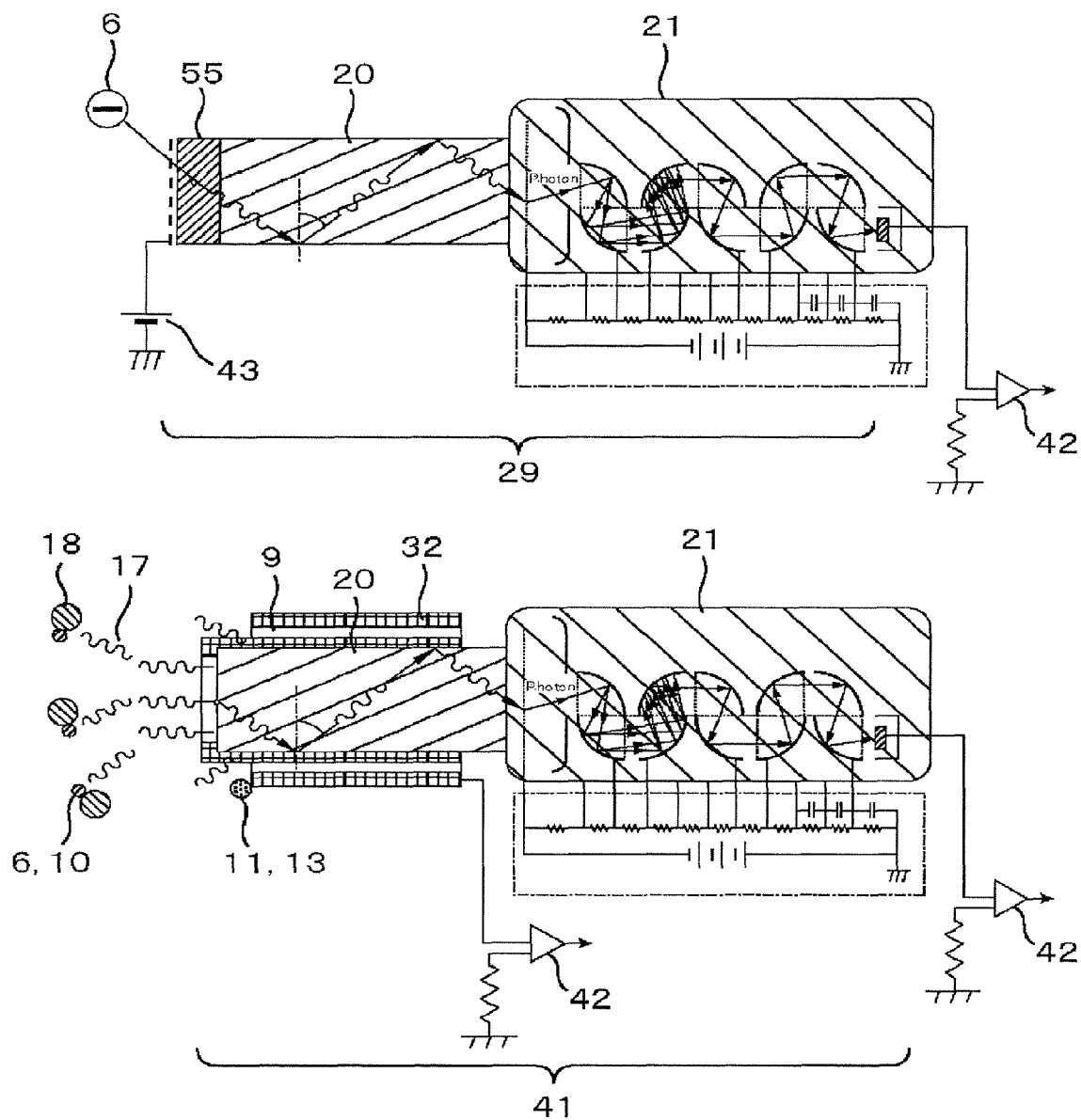
FIG. 2 is an enlarged view of a detector which is one example of the present invention and an Everhart Thornley detector (high-vacuum secondary electron detector).

Here, FIG. 2 is an enlarged view of a detector 41 according to the present invention.

A positive voltage of +300 V to +500 V is applied to the first electrode 9 disposed in the vicinity of the light guide 20, and a potential gradient is supplied to the inside of the observation sample chamber. The gas scintillation in the above items (3) and (4) is generated by this potential gradient at the same time as the cascade amplification caused by the electron avalanche in the above item (2). The positive ion current having the image information in the above item (2), that is, the positive ions 11 derived from the secondary electrons and the positive ions 13 derived from the reflection electrons, is detected by another second electrode 32 having a potential different from that of the first electrode 9, passes through an electrical amplification circuit, and is formed as the observation image by the control unit 22.

On the other hand, the light 17 having the image information in the above items (3) and (4) is detected directly by the light guide 20, is transmitted through the inside of the light guide, and enters the photomultiplier tube 21 coupled to the light guide. After that, the light is converted and amplified into photoelectrons, then is amplified with a desired gain by an electrical amplification circuit 42, and is formed as the observation image by the control unit 22 similarly.

The light guide illustrated in FIG. 2 is configured to be capable of sufficiently transmitting therethrough light ranging from the vacuum ultraviolet region to the visible region. In addition, the photomultiplier tube has performance which enables light ranging from the vacuum ultraviolet region to the visible region to be converted and amplified into photoelectrons.

Figure 3:
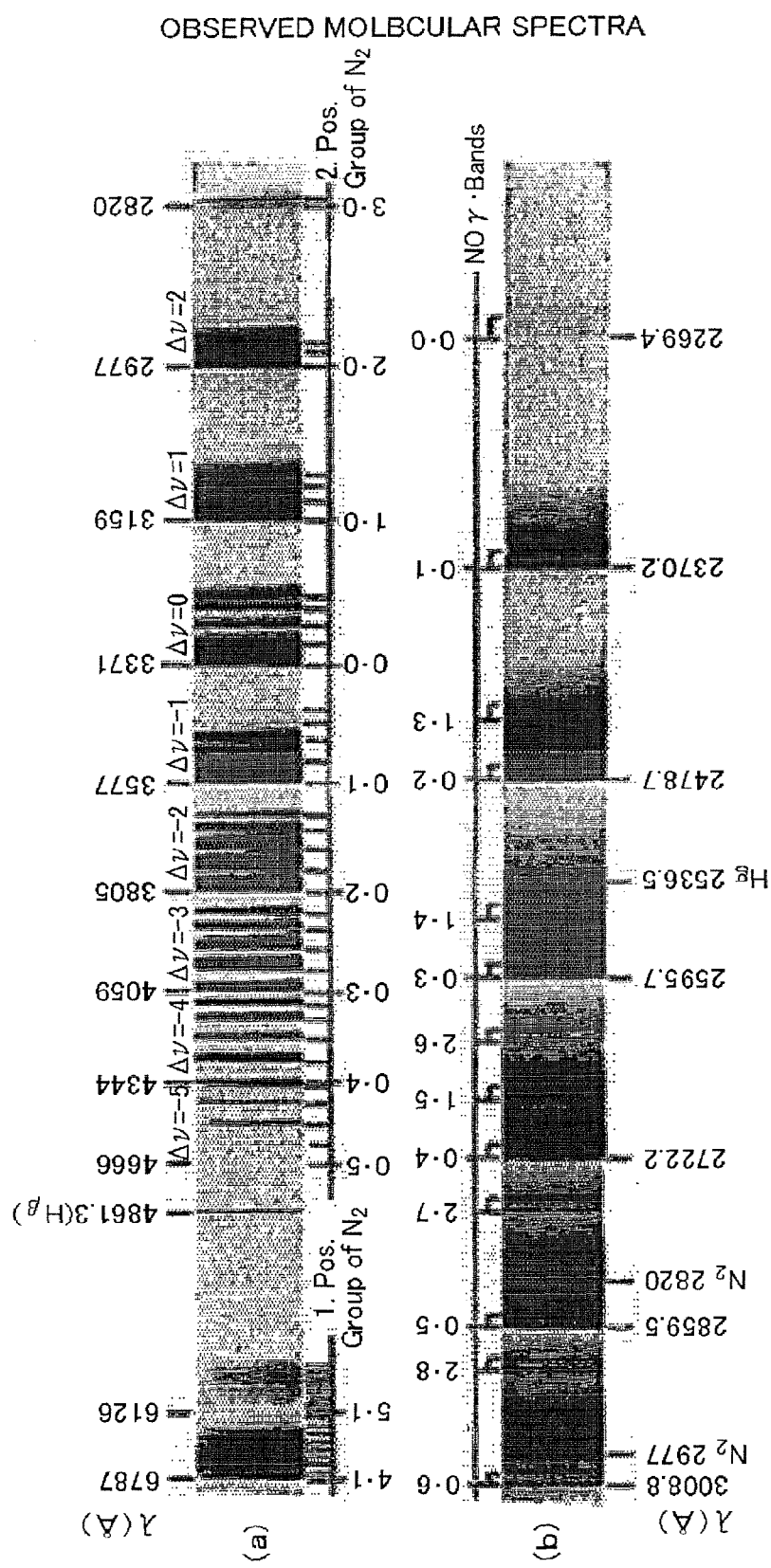
FIG. 3 are emission spectrum analysis result diagrams of the air (from Non Patent Literature 1).

With the use of FIG. 3, description is given below of the necessity to deal with the light ranging from the vacuum ultraviolet region to the visible region, in order to detect the light of this type. FIG. 3 show emission spectrum analysis results 44 of the air according to Non Patent Literature 1. As shown in the figures, main constituent molecules contained in the air are nitrogen, and results derived from nitrogen molecules are observed from the vacuum ultraviolet region to the visible region on the obtained emission spectrum. As described above, normally, the low-vacuum SEM is provided with a mechanism which keeps the inside of the observation sample chamber 8 at the given gas pressure 19 by opening/closing of the needle valve 28, and generally, the atmosphere (air) is introduced into the observation sample chamber 8. Accordingly, the spectrum of the light having the image information can be regarded as being substantially equivalent to the spectrum of nitrogen.

Here, in order to detect such light ranging from the vacuum ultraviolet region to the visible region, it is necessary that a light guide (optical waveguide) can sufficiently transmit therethrough the light in this range and the light can be converted and amplified into photoelectrons by the photomultiplier tube. With the use of the following expressions, description is given of effects when the light ranging from the vacuum ultraviolet region to the visible region is detected.

Figure 4:
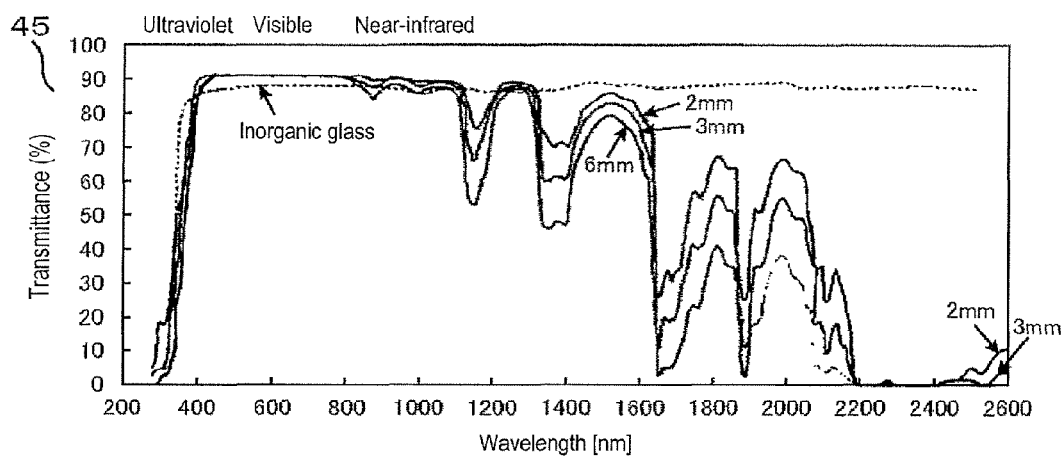
FIG. 4 are graphs showing light transmittances of acrylic and quartz (from data sheets of SUMIPEX, Sumitomo Chemical Co., Ltd./quartz, Shin-Etsu Chemical Co., Ltd.).
Figure 4:
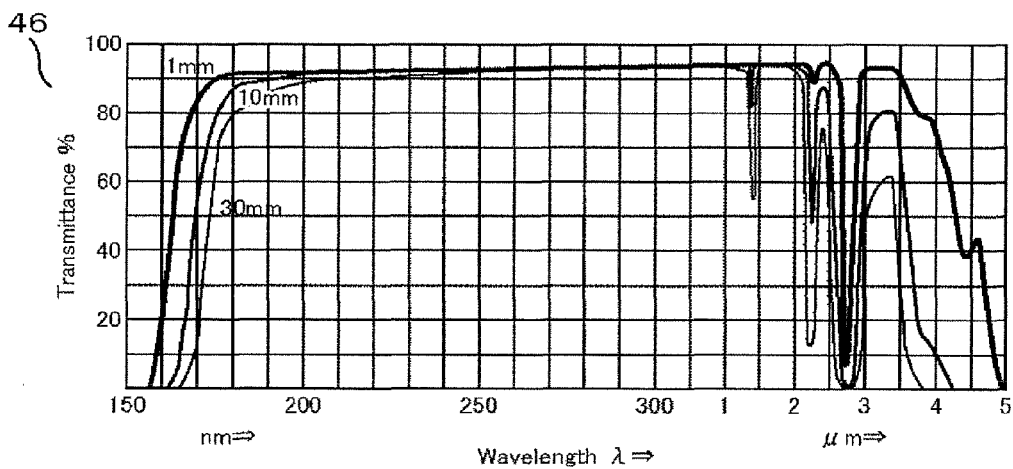

FIG. 4 show a light transmittance 45 of acrylic and a light transmittance 46 of quartz as material examples of the light guide. As shown in the figures, quartz sufficiently transmits therethrough the light ranging from the vacuum ultraviolet region to the visible region, compared with acrylic.

Figure 5:
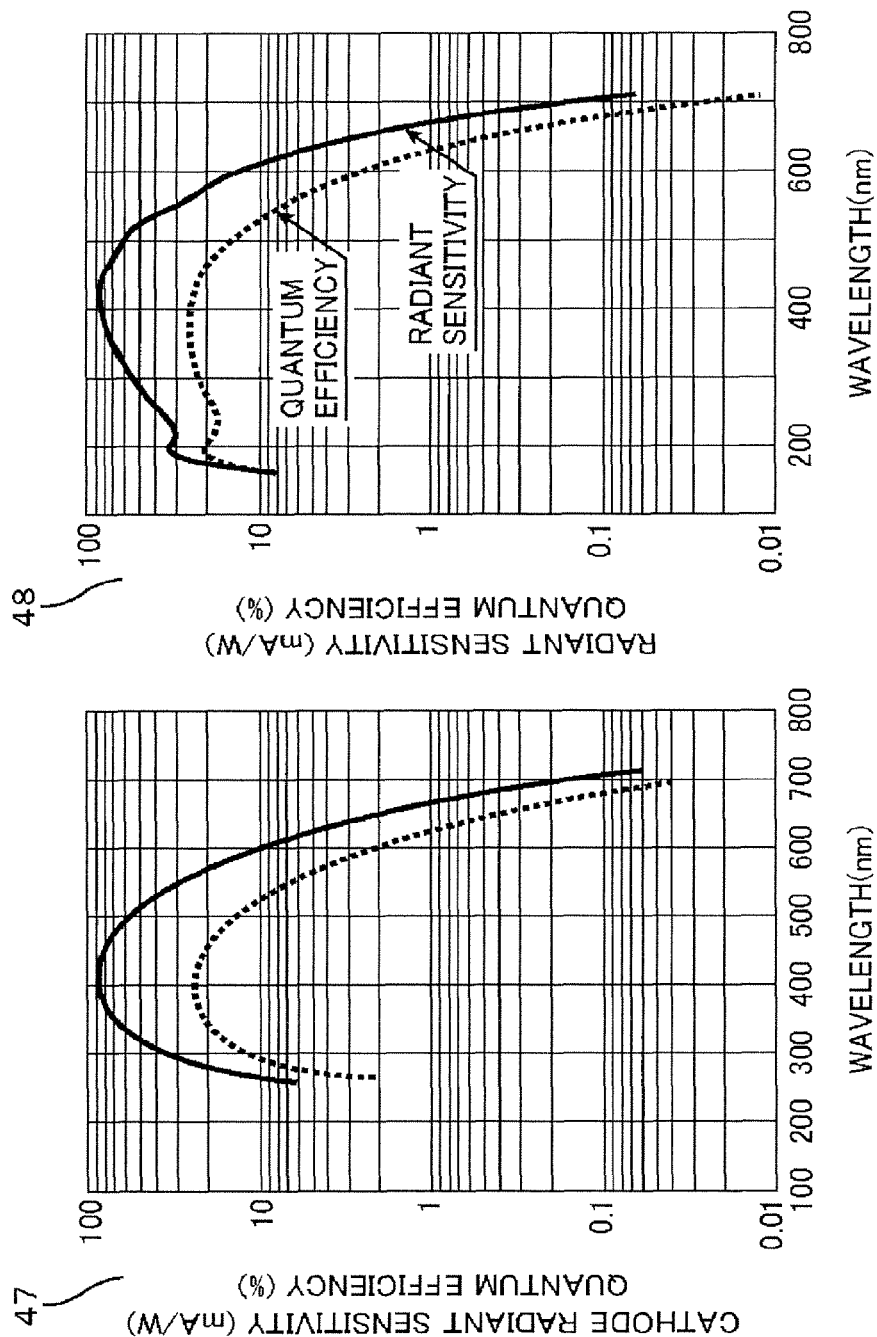
FIG. 5 are radiant sensitivity curve graphs of photomultiplier tubes (from a data sheet of Hamamatsu Photonics K.K.).

In addition, FIG. 5 show comparison between radiant sensitivity curves of the photomultiplier tubes, that is, a radiant sensitivity curve 47 of the photomultiplier tube normally used in the SEM and a radiant sensitivity curve 48 of the photomultiplier tube used in the present invention.

Assuming that the number of photons of light which enters the light guide is N, $\lambda$ is the wavelength, h is a Planck's constant ($6.626 \times 10^{-34}$ Js), c is the speed of light in a vacuum ($2.998 \times 10^8$ m/s), an amplification factor of the photomultiplier tube is G, an influence of the light transmittance of the light guide is $L(\lambda)$, a radiant sensitivity concerning a wavelength range dealt with by the photomultiplier tube is $P(\lambda)$, and a maximum wavelength and a minimum wavelength of the light which enters the light guide are respectively $\lambda_{max}$ and $\lambda_{min}$, a detection signal amount I which is taken out as an image signal from the photomultiplier tube is expressed as follows.

[Expression 1]

$$I = GNhc \int_{\lambda_{min}}^{\lambda_{max}} \frac{L(\lambda)P(\lambda)}{\lambda} d\lambda \qquad \text{Expression (1)}$$

Then, according to Expression (1), conditions for increasing the detection signal amount are as follows:

a. the amplification factor G of the photomultiplier tube is large;

b. the number N of photons of the light which enters the light guide is large; and c. the following right-hand side concerning the transmittance of the light guide and the radiant sensitivity of the photomultiplier tube is large.

[Expression 2]

$$\int_{\lambda_{min}}^{\lambda_{max}} \frac{L(\lambda)P(\lambda)}{\lambda} d\lambda$$

Among these conditions, a. and c. depend on the material of the light guide and the type of the photomultiplier tube. In general, the amplification factor of photoelectrons of the photomultiplier tube is $10^5$ to $10^6$, and hence c. is considered to be the condition relating to the entering light wavelength. Here, it is assumed that the wavelength of the light which enters the light guide is from the maximum wavelength $\lambda_{max}$=600 nm in the visible light region to the minimum wavelength $\lambda_{min}$=200 nm in the vacuum ultraviolet region. In addition, the following value is compared between: the case of applying specifications normally used in a standard SEM to the light guide and the photomultiplier tube; and the case of applying thereto specifications according to CLAIMS of the present invention.

[Expression 3]

$$\int_{\lambda_{min}}^{\lambda_{max}} \frac{L(\lambda)P(\lambda)}{\lambda} d\lambda$$

Case of the configuration normally used in the SEM (from the vicinity of 400 nm to 600 nm)

[Expression 4]

$$\int_{\lambda_{min}}^{\lambda_{max}} \frac{L(\lambda)P(\lambda)}{\lambda} d\lambda = \frac{211.6 \times 18.097}{160000} = 0.02393$$

Case of the configuration which sufficiently deals with up to the ultraviolet region (from 200 nm to 600 nm)

[Expression 5]

$$\int_{\lambda_{min}}^{\lambda_{max}} \frac{L(\lambda)P(\lambda)}{\lambda} d\lambda = \frac{368 \times 22.681}{160000} = 0.05217$$

As shown above, an effect of about 2.18 times can be expected.

Hereinabove, the spectrum of the light in the light emission phenomenon of the gas scintillation is examined, and the detection signal amount taken out as the image signal is examined, whereby importance of the above-mentioned invention can be confirmed.

With these results, the use of a low-vacuum scanning electron microscope having an optimal configuration makes it possible to bring out performance of the detection method using the light having the image information.

It should be noted that it is desirable that a shape of the light guide 20 have as large a detection area as possible, and further, irregularities may be formed on the surface of the light guide in order to increase the surface area.

On the other hand, the structure for the detection of the ion current having the image information can be relatively easily arranged. Because the electron avalanche (cascade gas amplification phenomenon) occurs most actively in the vicinity of the first electrode 9 to which a positive voltage is applied, the another second electrode 32 having a potential different from that of the first electrode 9 is provided at the position as illustrated in FIG. 2, and the ion current, that is, the positive ions 11 derived from the secondary electrons and the positive ions 13 derived from the reflection electrons are detected by the another second electrode 32.

The image signal current thus obtained is subjected to signal processing by the control unit 22 as illustrated in FIG. 1 or as described above, so that observation thereof becomes possible.

It is considerably effective to dispose the electrodes in the vicinity of the light guide in this way, in terms of the fact that light (particularly, vacuum ultraviolet light) which is generated at a place in which the cascade amplification phenomenon is occurring can also be detected efficiently. In the above-mentioned embodiment, the electrodes are disposed around the light guide, but similar effects can be expected as long as the electrodes are disposed near the light guide.

Embodiment 2

The shapes of the first electrode 9 and the second electrode 32 are described.

A main function of the first electrode 9 is to form a potential gradient inside of the observation sample chamber 8 adjusted to a desired gas pressure, specifically, to form a concentrated potential gradient which actively causes the light emission phenomenon of the gas scintillation and the electron avalanche (cascade gas amplification phenomenon).

Figure 6:
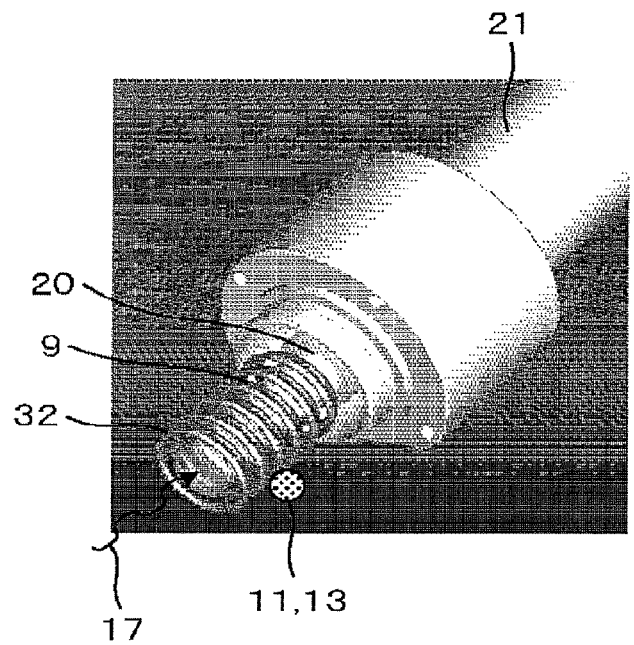
FIG. 6 is a schematic view illustrating a configuration example of an electrode of the detector which is one example of the present invention.
Figure 7:
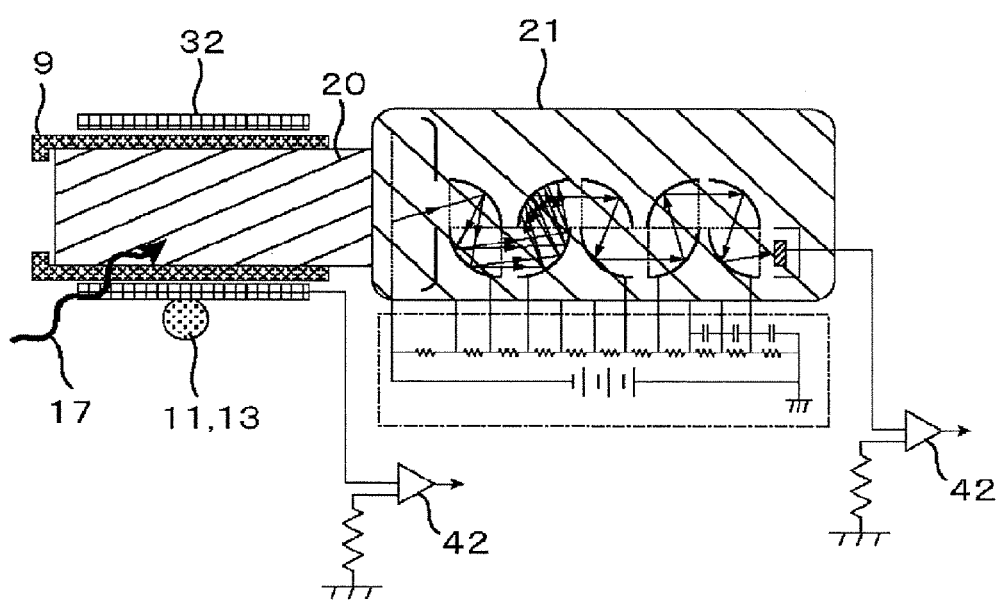
FIG. 7 is a schematic view illustrating a configuration example of the electrode of the detector which is one example of the present invention.

Accordingly, when the shape of the first electrode 9 is a mesh-like pattern with an interval of several μm to several mm, a plate-like pattern, a multi-bar-like pattern, or a ring-like pattern as illustrated in FIG. 6, effects of the phenomena can be obtained at low cost. Particularly, in the case where the electrode is formed into the multi-bar-like pattern, a leading end part thereof facing the sample 5 may be formed into a sharp shape like a needle.

What is important for the shape of the first electrode 9 is that, because the light guide 20 which detects light is disposed in the vicinity thereof, it is necessary to form the first electrode 9 so as not to block the light which enters the light guide 20. In addition, as described above, the first electrode 9 controls the phenomena which directly contribute to the image.

Therefore, control of the voltage of the first electrode 9 and the gas pressure of the observation sample chamber is made possible. An optimal condition table according to each voltage, each gas pressure, and each type of gas may be experimentally obtained in advance, and a system in which an optimal condition is automatically selected only by inputting, on a GUI, necessary information requested by a user may be constructed.

In addition, a main function of the second electrode 32 is to detect the ions 11 and 13 having the image information which are amplified by the electron avalanche (cascade gas amplification phenomenon). Accordingly, the second electrode 32 is connected to the electrical amplification circuit 42 which performs amplification with a desired gain, and the detected signal current needs to be electrically amplified immediately. In addition, because the extreme vicinity of the first electrode 9 to which a positive voltage is applied is the optimal position, it is necessary to form the second electrode 32 so as not to block the light which enters the light guide 20, as pointed out with regard to the shape of the first electrode 9.

Accordingly, similarly when the shape of the second electrode 32 is a mesh-like pattern with an interval of several μm to several mm, a plate-like pattern, a multi-bar-like pattern, a ring-like pattern as illustrated in FIG. 6, or the like, effects can be obtained at relatively low cost. With regard to the arrangement thereof, the second electrode 32 may be arranged on an inner side or an outer side of the first electrode 9.

Embodiment 3

Figure 8:
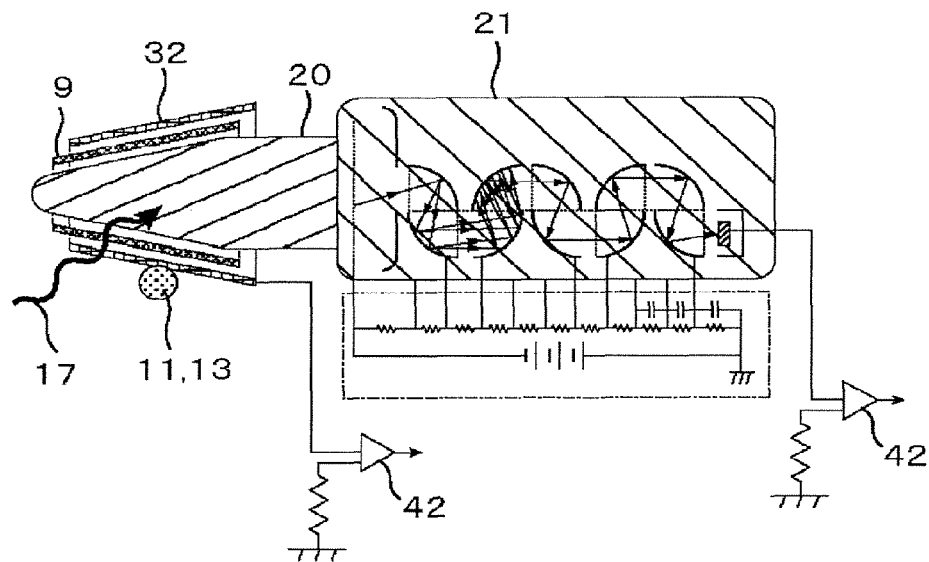
FIG. 8 is a schematic view illustrating a configuration example of a light guide and the electrode of the detector which is one example of the present invention.

FIG. 8 illustrates another embodiment of a charged particle beam device including a configuration of Claim 1. The present embodiment is the same as Embodiment 1 except for the shape of the light guide. The shape of this light guide is differentiated from the others by taking the entering light and the shape of the light guide into consideration.

This light guide is tapered so as to be sharp toward the entering light, and is adapted to receive light which enters in various directions, on a surface thereof as far as possible. In order to transmit the light without any loss, this light guide may be formed at an angle obtained by considering a total internal reflection critical angle ψ which is calculated from a refractive index $n_1$ of the light guide and an entering angle θ of the light as described below.

[Expression 6]

$$\sin\psi = \frac{\sin\theta}{n} = \frac{\sin(90°)}{1.49} = 0.6711$$

$$\therefore \psi = \sin^{-1}(0.6711) = 42.155°$$

In the case where the entering angle θ is 90 degrees, that is, the light perpendicularly enters the surface of the light guide, because the refractive index n of a general material (acrylic PMMA resin) of the light guide is around 1.49 to 1.5, the total internal reflection critical angle ψ is about 42 degrees according to the above expression.

In addition, in the case where the light guide has a columnar shape, only light which is emitted at within about 42 degrees corresponding to a half angle of the solid angle at the position, of the light received by a bottom surface of the columnar shape, is totally reflected on an outer circumferential surface inside of the light guide, and is transmitted to a surface thereof at another end. Such total internal reflection is transmission with small loss and high efficiency. Assuming that a refractive index $n_0$ of the air=1, light which is isotropically generated travels inside of the light guide while being confined therein at the following ratio.

[Expression 7]

$$\frac{1}{2}(1 - \sin\psi) = \frac{1}{2}\left(1 - \frac{n_0}{n_1}\right) = 16.7\%$$

As is apparent from the above expression, for one of examination points for increasing a ratio of the transmission of light, it is preferable to select a material having as large a refractive index as possible, and this holds true for a high-vacuum secondary electron detector.

Embodiment 4

Figure 9:
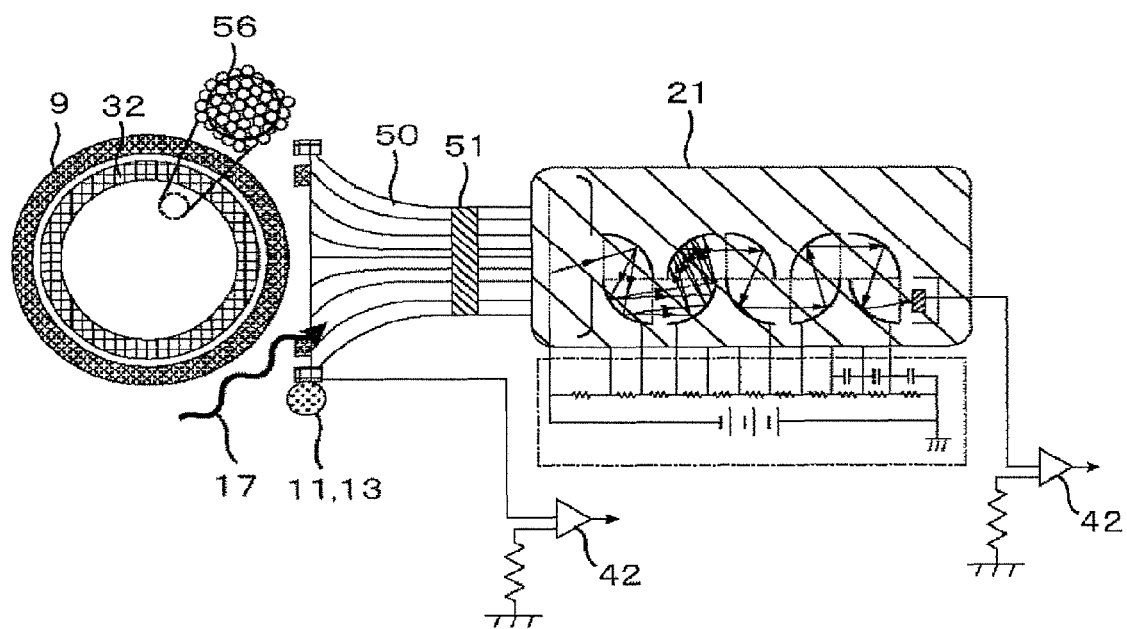
FIG. 9 is a schematic view illustrating a configuration example of the light guide and the electrode of the detector which is one example of the present invention.

FIG. 9 illustrates another embodiment of the charged particle beam device including the configuration of Claim 1. The present embodiment is the same as Embodiment 1 except for the shape of the light guide. The shape of this light guide is differentiated from the others by taking the entering light and the shape of the light guide into consideration.

This light guide is formed by bundling several thin linear optical fibers 56 with a band 51. A detection light receiving surface of a light guide 50 of the bundled optical fibers spreads in a trumpet-like shape, and detects light approaching the detector in various directions. Because the entering light enters the light guide substantially radially from the sample 5 which is the image signal source, in consideration of this, a method of detecting the light by means of leading end parts of the optical fibers which face various directions in the trumpet-like shape is adopted.

The light is totally reflected inside of each of the bundled optical fibers in the light guide 50 to be transmitted to a terminal end. After that, the transmitted light is immediately guided to the photomultiplier tube coupled thereto, and an image is formed via the electrical amplification circuit 42.

Embodiment 5

Figure 10:
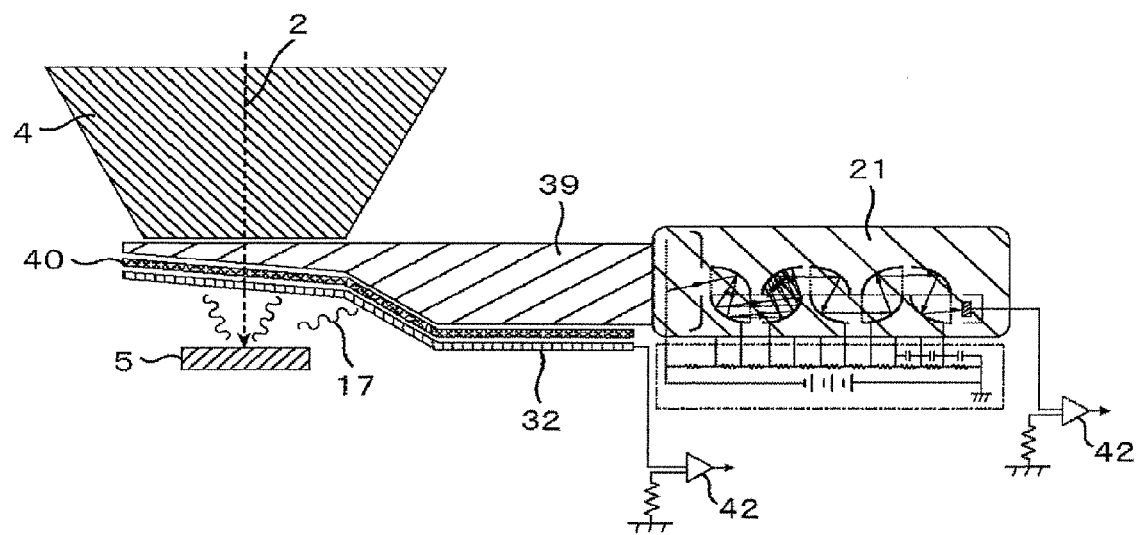
FIG. 10 is a schematic view illustrating a configuration example of the light guide and the electrode of the detector which is one example of the present invention.
Figure 10:
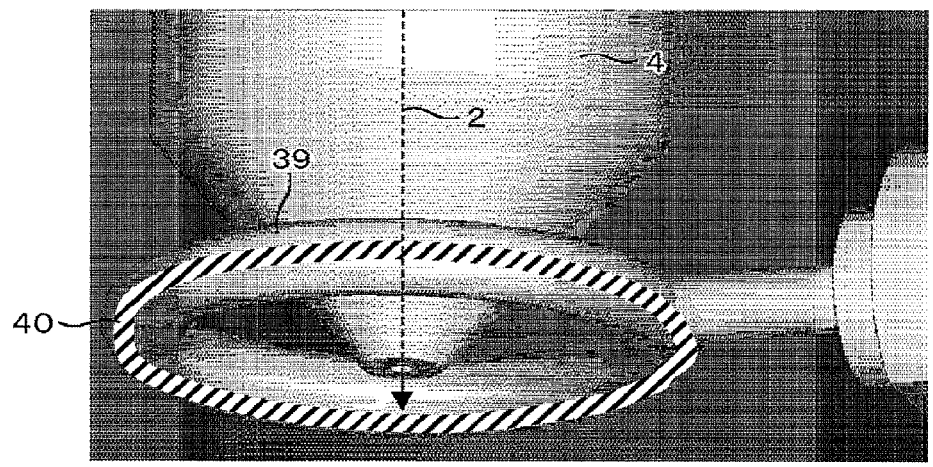

FIG. 10 illustrates another embodiment. The present embodiment is the same as Embodiment 1 except for the shape of the light guide. The shape of this light guide is specially directed to the method of detecting the light having the image information, and is differentiated from the others in that: a second light guide 39 is extended to the vicinity of the objective lens and is disposed immediately above the sample 5 to be observed; and a fifth electrode 40 corresponding to the first electrode 9 is configured together with the second light guide 39.

The present embodiment has an object to reduce a distance between the sample 5 and the light guide which is the detection unit, and has features that an observation working distance (WD) can be minimized, light can be detected with higher efficiency, and high-resolution observation is possible.

As illustrated in FIG. 10, the primary electron beam passes through the vicinity of the light guide according to the present embodiment, and hence electrical conductivity is given to the vicinity thereof. Light generated by the light emission phenomenon of the gas scintillation which occurs between the sample 5 and the fifth electrode 40 is immediately detected by the second light guide 39. The second light guide 39 to be disposed may have a shape which surrounds the vicinity of the objective lens in a ring-like pattern as illustrated in FIG. 10.

Embodiment 6

Figure 11:
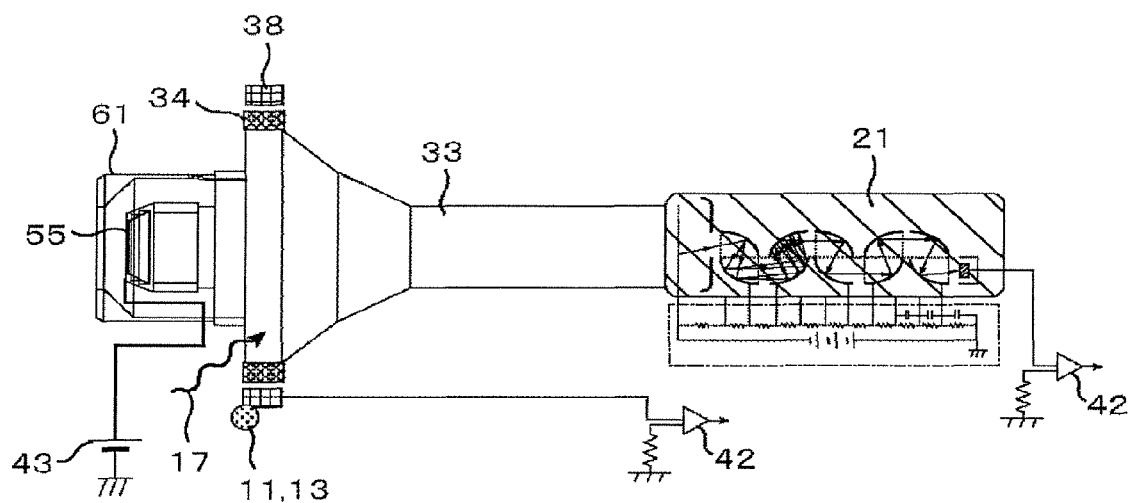
FIG. 11 is a schematic view illustrating a configuration example of the light guide and the electrode of the detector which is one example of the present invention.

FIG. 11 illustrates another embodiment of the present invention. The present embodiment is the same as Embodiment 1 except for the light guide 20, the first electrode 9, and the second electrode 32. The present embodiment is differentiated from the others by applying a secondary electron detector for high vacuum to Embodiment 1 with the light guide 20, the first electrode 9, and the second electrode 32 being different from those of Embodiment 1 as described above, and the embodiment for realizing this is illustrated in FIG. 11.

The light guide 20 is configured as a double-function light guide 33 and has a structure which is divided into two functions for a high-vacuum secondary electron detector and for detection of light under low vacuum. The double-function light guide 33 may be formed of one material and one part, or may be formed of an optical fiber which can transmit therethrough light ranging from the vacuum ultraviolet region to the visible region and can be bent into an arbitrary shape.

In addition, a third electrode 34 corresponding to the first electrode 9 is disposed at a position at which the third electrode 34 does not obstruct the orbits of high-vacuum secondary electrons, for example, as illustrated in FIG. 11. Similarly to Embodiment 1, when the shape thereof is a mesh-like pattern with an interval of several μm to several mm, a ring-like pattern, a plate-like pattern, a multi-bar-like pattern, or the like, effects can be obtained at relatively low cost.

In addition, similarly to Embodiment 1, a fourth electrode 38 corresponding to the second electrode 32 is arranged on an inner side or an outer side of the third electrode 34. Similarly when the shape thereof is a mesh-like pattern with an interval of several μm to several mm, a ring-like pattern, a plate-like pattern, a multi-bar-like pattern, or the like, effects can be obtained at relatively low cost.

An effect obtained by Embodiment 3 is that the charged particle beam device including the detector which is integrated irrespective of a vacuum mode for the purpose of observing an image can be provided to a user.

In an existing scanning electron microscope, normally, a detector dedicated to high-vacuum secondary electron observation is applied under high vacuum, and detection dedicated to low-vacuum secondary electron observation using ion current detection is applied under low vacuum. Accordingly, the observation sample chamber 8 is equipped with ports for respectively disposing the two.

On the other hand, in the case of the configuration according to the present embodiment, a port for the detector to be prepared in the observation sample chamber can be configured only by a port for the detector integrated irrespective of the vacuum mode. Against the needs of recent years that an increasing number of users desire a wide variety of observations, this effect can provide a scanning electron microscope having scalability for attaching special auxiliary equipment which is specially designed in accordance with a customer's desire, in addition to various analysis devices (other devices which deal with X-rays, such as WDX: wavelength-dispersive X-ray analyzer and EDX: energy-dispersive X-ray analyzer, EBSP: crystal particle analyzer, CL: cathode luminescence spectrometer, Raman spectrometer, and the like). In addition, owing to a difference in obtained image quality, it is possible to be free from the concept of the vacuum mode and observe a characteristic secondary electron image, and it is thus possible to expect an effect that a wide range of users can seamlessly perform surface observation without paying attention to the type of a sample to be observed.

Embodiment 7

Figure 12:
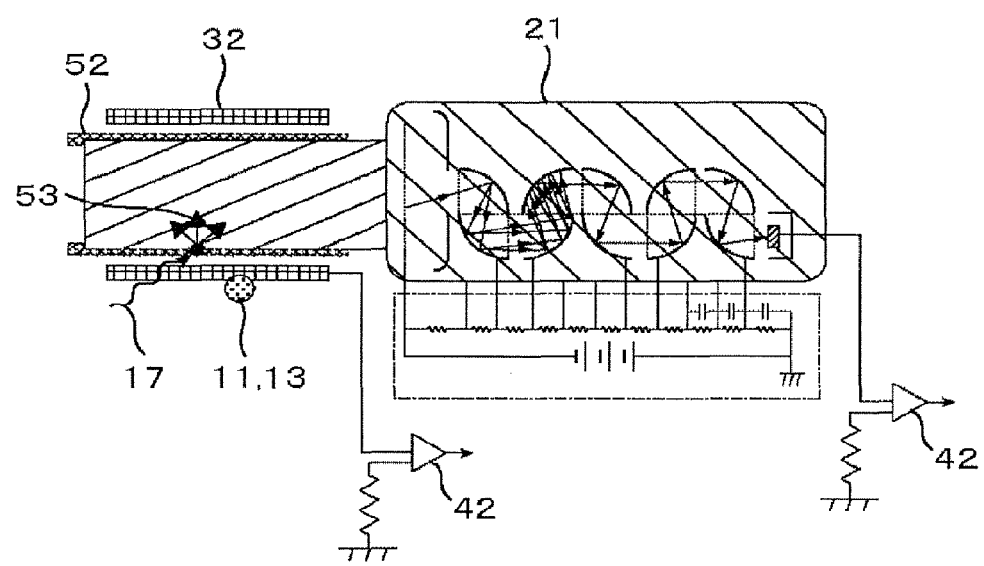
FIG. 12 is a schematic view illustrating a configuration example of the light guide and the electrode of the detector which is one example of the present invention.

FIG. 12 illustrates another embodiment. The present embodiment is similar to the configuration described in Embodiment 1, but is differentiated from the others in that the used photomultiplier tube is an existing photomultiplier tube, that is, a wavelength range dealt with thereby is the visible region (particularly, the vicinity of 420 nm).

Because the wavelength range dealt with by the photomultiplier tube which converts and amplifies light into photoelectrons is the visible region, in order to efficiently convert the light into the photoelectrons, it is necessary to convert the wavelength of detected light containing light in the vacuum ultraviolet region into light in the visible region by some sort of means. Such means therefor can be realized by applying a phosphor which reacts to light in the vacuum ultraviolet region to emit light in the visible region, to the surface of the light guide 20, for example, as illustrated in FIG. 12. The phosphor of this type contains such components as $BaMgAl_{10}O_{17}$:Eu and the like, and is used for a PDP (plasma display) of recent years and the like. In the case of using the phosphor which emits light in reaction to light in the vacuum ultraviolet region, a slight delay in response (several hundred μs) is anticipated compared with direct detection by the light guide, but a high scanning speed in the SEM is normally up to 0.033 s/frame (up to 33 ms/frame), and hence this delay in response does not become problematic. Irregularities are formed on a surface of a light guide 35 for wavelength conversion used in the present embodiment, whereby the application of the phosphor to the surface may be facilitated. In addition, such irregularities may be formed in advance into a shape obtained by considering a critical reflection angle depending on the material of the light guide as in Embodiment 2.

Embodiment 8

Next, on the basis of an idea similar to that of Embodiment 7, it is considered that the wavelength of entering light is converted. As a matter of convenience, description is given by using the detector 41 of the present invention in FIG. 2.

The light guide 20 used in FIG. 2 is replaced with the light guide 35 for wavelength conversion, and at this time, a photomultiplier tube normally used in the SEM is used without any change.

The light guide for wavelength conversion, which converts light in the ultraviolet region into light in the visible region, has some problem in conversion efficiency, but is advantageous in that the photomultiplier tube normally used in the SEM can be used. In this case, although the method considerably resembles that of Embodiment 7, sufficient effects can be expected only by simply changing the material of the light guide while omitting the trouble of applying the phosphor.

Embodiment 9

Figure 13:
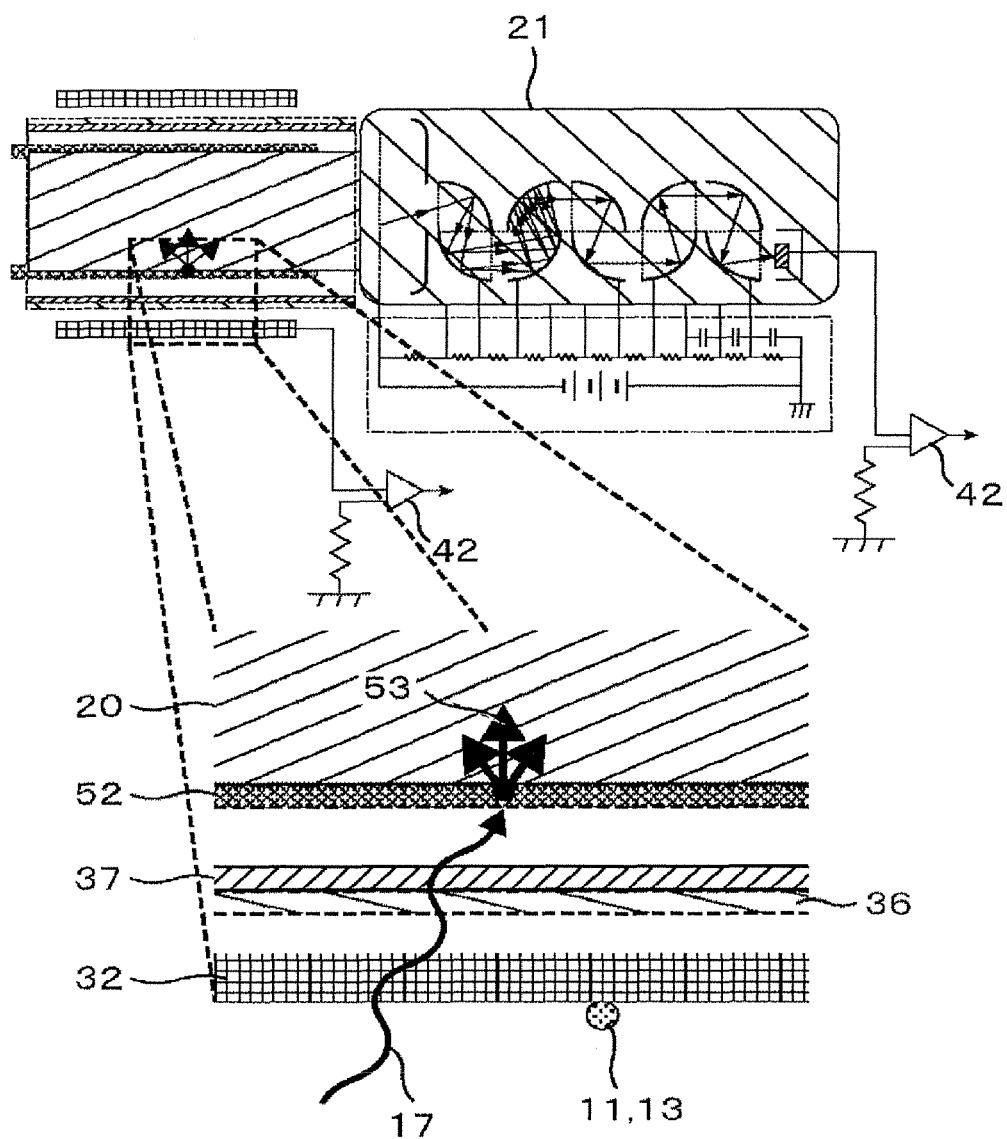
FIG. 13 is a schematic view illustrating a configuration example of the light guide and the electrode of the detector which is one example of the present invention.

FIG. 13 illustrates another embodiment. The present embodiment is similar to the configuration described in Embodiment 1, but is differentiated from the others in that a transparent electrode 36 which can sufficiently transmit therethrough the light having the image information is vapor-deposited on the surface of the light guide, as an electrode corresponding to the first electrode 9 in the vicinity of the light guide.

In recent years, it is becoming possible to easily utilize technologies developed for a PDP (plasma display). The transparent electrode according to the present embodiment is one of those technologies, and this is applied to the present invention. The type of light to be dealt with, that is, light in the vacuum ultraviolet region, light emission of the phosphor, and the technology for the PDP including the transparent electrode can be sufficiently applied to a detector structure according to the present embodiment. As illustrated in FIG. 13, a thin film having electrical conductivity and high transparency, such as an ITO vapor-deposited film, is vapor-deposited on a surface of a combined light guide 37 having high transparency and transmission. This thin film having electrical conductivity and high transparency is immediately caused to function correspondingly to the first electrode 9, whereby it is possible to generate the light emission phenomenon of the gas scintillation and the cascade gas amplification phenomenon as described in Embodiment 1 and Embodiment 3. What is greatly different from Embodiment 1 and Embodiment 3 is that there is no fear that such structures as the first electrode 9 and the second electrode 32 are disposed in the vicinity of the light guide which is the detection unit, to thereby block the entering light.

It is desirable that irregularities be formed on the surface of the combined light guide 37, and protrusions thereof may be formed so that effects similar to those of the first electrode 9 described in Embodiment 1 can be obtained.

In the present embodiment, only the transparent electrode may be simply vapor-deposited on the surface of the light guide, and alternatively, as illustrated in FIG. 13, it is also possible to adopt a double structure using the combined light guide 37 having one side on which the transparent electrode 36 is vapor-deposited and another side to which the phosphor described in Embodiment 5 is applied.

Embodiment 10

Figure 14:
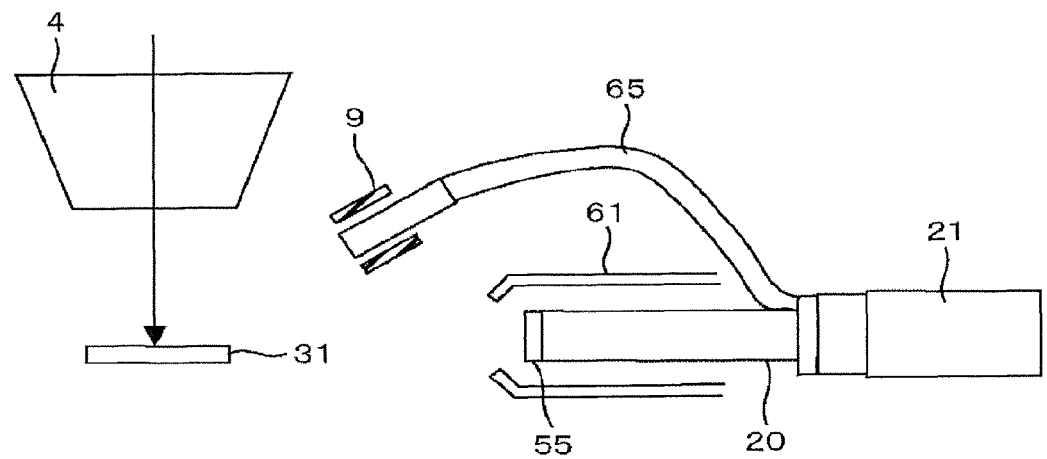
FIG. 14 is a schematic view illustrating a configuration example of the light guide and the electrode of the detector which is one example of the present invention.

FIG. 14 illustrates another embodiment. The present embodiment is differentiated from the other embodiments in that: an optical path is branched by using the light guide 20 and a branching light guide (made of an optical fiber) 65; the optical path of the light guide is used at the time of a high vacuum, whereas the optical path made of the optical fiber is used at the time of a low vacuum; and detection and image formation are performed by using one photomultiplier tube.

In the case of a light guide made of acrylic, quartz, or the like which can transmit therethrough light having a wide wavelength, it is difficult to branch an optical path thereof in terms of problems of a material, production, and the like. In addition, a direction of light emitted inside of the sample chamber is not necessarily one, and hence it is desirable that the optical path can be freely bent and can be freely disposed at an optimal position.

The configuration illustrated in FIG. 14 can solve the above-mentioned problems and troubles at a time. On this occasion, as described in (Embodiment 1), it is desirable to provide a photomultiplier tube having a feature of being operable from the ultraviolet region to the visible region. The electrode as described in the above-mentioned embodiments is provided around an optical fiber leading end detection unit used for light detection under low vacuum (in FIG. 14, around a leading end part of the branching light guide 65 and the first electrode 9).

Embodiment 11

In relation to the configuration illustrated in FIG. 8, in the optical path (light guide), it is possible to enable detection not only by a surface facing the sample but also by a side surface of the light guide. According to a general usage of the light guide, detection is performed by a planar surface facing the sample, but can be performed also by a side surface of the light guide in order to detect emitted light to the maximum.

Embodiment 12

Figure 15:
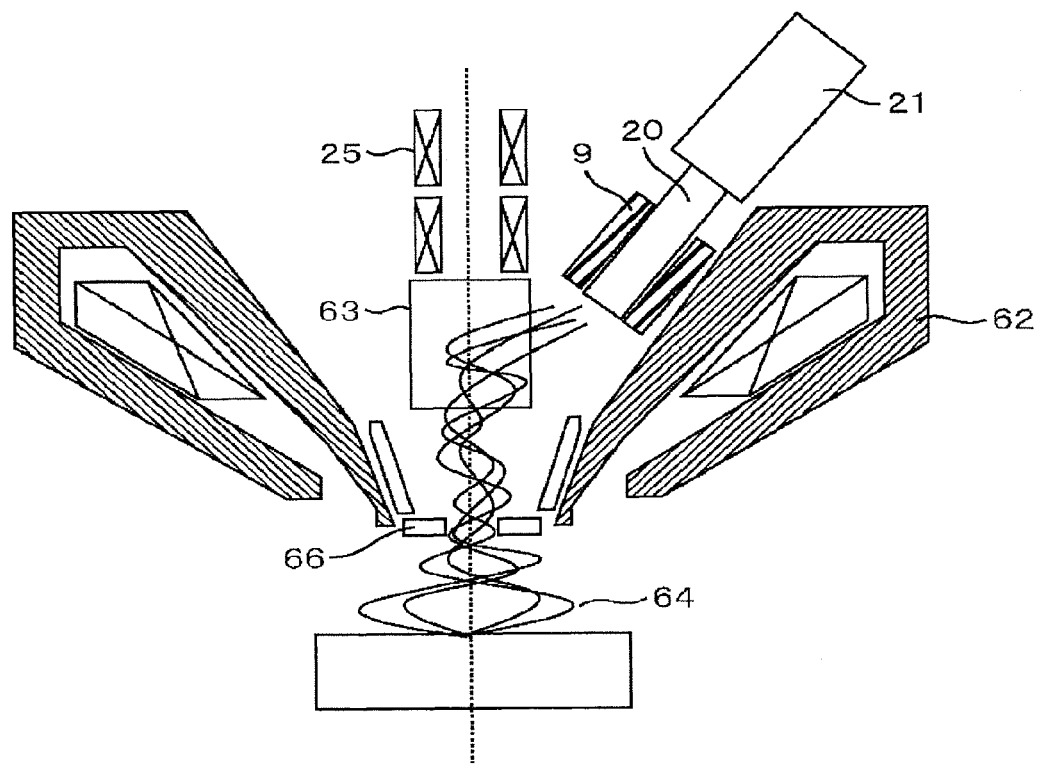
FIG. 15 is a schematic view in which the light guide and a semi-in-type objective lens of the detector which is one example of the present invention are configured.

FIG. 15 illustrates another embodiment. The present embodiment is differentiated from the other embodiments in that: high resolution is achieved by using a semi-in-type objective lens 62; observation in both a high-vacuum mode and a low-vacuum mode is made possible by providing an exhaust orifice 66 for vacuum operation; a gas amplification action in which secondary electrons 64 and gas molecules collide against each other is utilized, the secondary electrons 64 being moved up inside of the objective lens by an influence of a leakage magnetic field generated by the semi-in-type objective lens, the gas molecules remaining inside of the objective lens; and light which is emitted at the time of the gas amplification action is detected for forming the image.

In the case where the semi-in-type objective lens is used under low vacuum, in general, the exhaust orifice for vacuum operation is provided at a position of a main surface of the lens corresponding to a maximum magnetic field. About 100 µm to 1,000 µm is selected as a hole diameter of the orifice, and the secondary electrons generated from the sample are moved up by the influence of the magnetic field of the semi-in-type objective lens, pass through this hole, and are drawn into the lens. In a charged particle beam device which utilizes the action of moving up the secondary electrons by the magnetic field, only the secondary electrons which are moved up from the surface of the sample can be captured by E×B (Wien filter) at a detection efficiency substantially equal to 100% without affecting the primary electron beam.

The present embodiment provides a detection method under low vacuum which is greatly different from those of the other embodiments in that the above-mentioned action is utilized to thereby realize highly-efficient detection of light and high resolution by means of a larger amount of secondary electrons and lower aberration of the semi-in-type objective lens.

Figure 16:
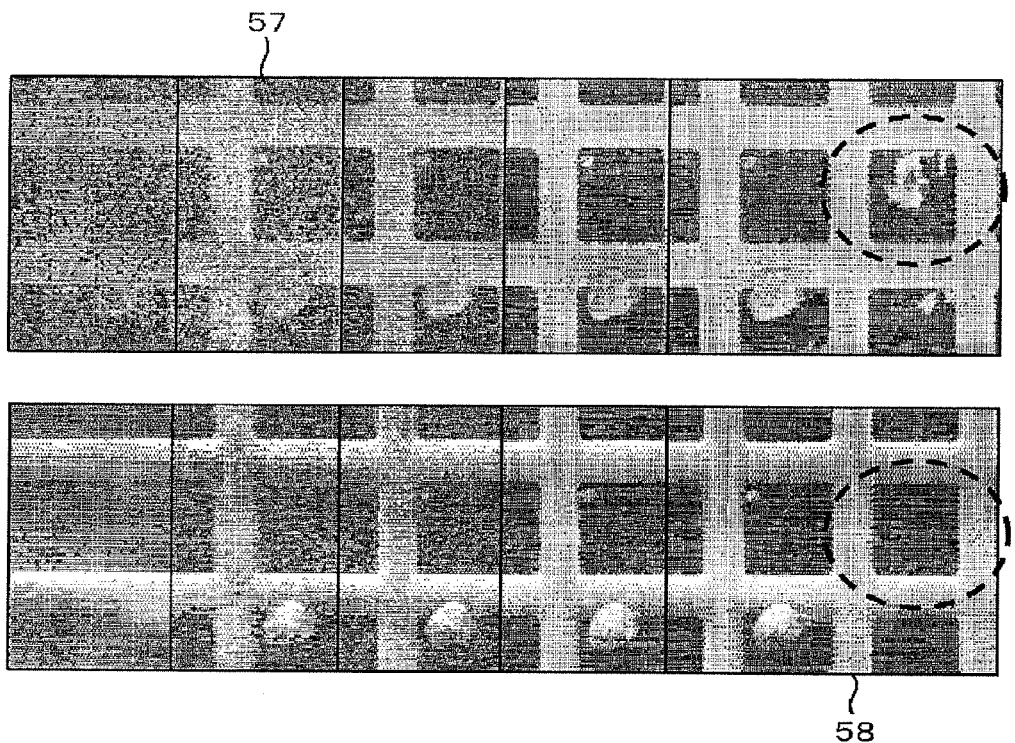
FIG. 16 is a view illustrating: an image acquired by the detector which is one example of the present invention; and an SEM image acquired according to a conventional method.
Figure 17:
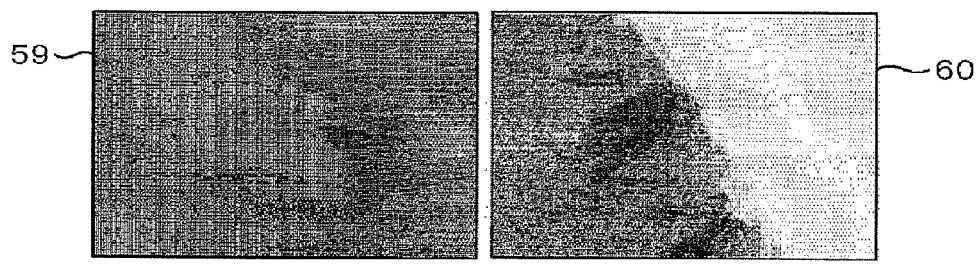
FIG. 17 is a view illustrating: an image acquired by the detector which is one example of the present invention; and an SEM image acquired according to a conventional method.

Lastly, effects of obtained images are illustrated in FIG. 16 and FIG. 17.

The light and the ion current each having the image information are detected at the same time, and are observed at the same time, so that an observation picture as illustrated in FIG. 16 can be photographed. FIG. 16 illustrates an ion current image 57 having the image information and an image 58 obtained by detecting the light having the image information. As illustrated in FIG. 16, both the images considerably closely resemble a high-vacuum secondary electron image, but contrasts thereof which are partially different can be observed. There is a high chance that a large number of users in a biological/chemical materials field, a geological field, a semiconductor field, and the like desire to observe, at the same time, images having contrasts which are different depending on the type of the sample 5.

In addition, FIG. 17 illustrates an image 59 at the time of high-speed scanning by detecting the ion current having the image information and an image 60 at the time of high-speed scanning by detecting the light having the image information. The comparison between these images shows particularly characteristic performance when the light having the image information is detected. Originally, the detection is performed by using light, and hence, as described above, this makes a difference in response performance of an image signal from the ions having a relatively low flowing speed. In addition, the amplification is performed not by the electrical amplification circuit as in the ion current detection method but by the photomultiplier tube. Therefore, it is possible to respond at high speed to a signal for forming an observation image by the control unit 22 in accordance with a high scanning speed of a TV (up to 0.033 s/frame).

| Reference Signs List | |
|---|---|
| 1 | electron source |
| 2 | primary electron beam |
| 3 | multi-stage lens |
| 4 | objective lens |
| 5 | sample |
| 6 | secondary electrons |
| 7 | reflection electrons |
| 8 | observation sample chamber |
| 9 | first electrode |
| 10 | electrons derived from secondary electrons |
| 11 | positive ions derived from secondary electrons |
| 12 | electrons derived from reflection electrons |
| 13 | positive ions derived from reflection electrons |
| 14 | ground state |
| 15 | excited state |
| 16 | transition energy |
| 17 | light having image information (ultraviolet region/visible region) |
| 18 | gas molecules |
| 19 | gas pressure |
| 20 | light guide |
| 21 | photomultiplier tube (PMT) |
| 22 | (image formation) control unit |
| 23 | image processing terminal |

-continued

Reference Signs List

| | |
|---|---|
| 24 | observation condition control unit |
| 25 | deflector |
| 26 | deflection signal control unit |
| 27 | atmosphere introduction port |
| 28 | needle valve |
| 29 | Everhart Thornley detector (high-vacuum secondary electron detector) |
| 30 | secondary electron collector electrode |
| 31 | reflection electron detector |
| 32 | second electrode |
| 33 | double-function light guide |
| 34 | third electrode |
| 35 | light guide for wavelength conversion |
| 36 | transparent electrode |
| 37 | combined light guide |
| 38 | fourth electrode |
| 39 | second light guide |
| 40 | fifth electrode |
| 41 | detector of the present invention |
| 42 | electrical amplification circuit |
| 43 | +10 kV |
| 44 | emission spectrum analysis results of air |
| 45 | light transmittance of light guide (acrylic) |
| 46 | light transmittance of quartz |
| 47 | radiant sensitivity curve of photomultiplier tube normally used in SEM |
| 48 | radiant sensitivity curve of photomultiplier tube used in the present invention |
| 49 | tapered light guide |
| 50 | light guide of bundled optical fibers |
| 51 | band |
| 52 | phosphor which reacts to light in ultraviolet region to emit light |
| 53 | light having image information in visible region |
| 54 | overall SEM control unit |
| 55 | scintillator for high-vacuum secondary electron detector |
| 56 | optical fiber thin line |
| 57 | ion current image |
| 58 | image of light having image information |
| 59 | image at the time of high-speed scanning by detecting ion current |
| 60 | image at the time of high-speed scanning by detecting light having image information |
| 61 | earth electrode |
| 62 | semi-in-type objective lens |
| 63 | ExB (Wien filter) |
| 64 | secondary electrons moved up by magnetic field |
| 65 | branching light guide (made of optical fiber) |
| 66 | exhaust orifice for vacuum operation |

The invention claimed is:

1. A charged particle beam device, comprising:
a charged particle source;
a charged particle optical system which focuses a primary charged particle beam emitted from the charged particle source to scan a sample therewith; and
a sample chamber which is capable of keeping its inside with a constant gas pressure,
wherein the charged particle beam device further comprises:
 a detector that includes: an electrode to which a positive voltage is applied; and
 a light guide which can transmit therethrough light at least ranging from a vacuum ultraviolet light region to a visible light region,
 wherein the detector detects, by the light guide, light of gas scintillation generated by the electrode.

2. The charged particle beam device according to claim 1, wherein a material of the light guide is quartz.

3. The charged particle beam device according to claim 1, wherein the light of gas scintillation is derived from nitrogen molecules.

4. The charged particle beam device according to claim 1, wherein a voltage of the electrode and a gas pressure of the sample chamber are controlled by selection of an optimal condition table which is obtained in advance.

5. The charged particle beam device according to claim 1, wherein shape of the electrode is a mesh-like pattern, a ring-like pattern, a plate-like pattern, or a multi-bar-like pattern.

6. The charged particle beam device according to claim 1, wherein light from a side surface of the light guide is detected.

7. The charged particle beam device according to claim 1, wherein the light guide is configured with a plurality of optical fibers.

8. The charged particle beam device according to claim 1, wherein:
 the light guide is extended to bottom of an objective lens of the charged particle optical system, and
 the light guide is disposed above the sample.

9. A detector equipped in a charged particle beam device, the charged particle beam device comprising:
a charged particle source;
a charged particle optical system which focuses a primary charged particle beam emitted from the charged particle source to scan a sample therewith; and
a sample chamber which is capable of keeping its inside with a constant gas pressure,
wherein the detector comprises:
 an electrode to which a positive voltage is applied; and
 a light guide which can transmit therethrough light at least ranging from a vacuum ultraviolet light region to a visible light region,
 wherein the detector detects, by the light guide, light of gas scintillation generated by the electrode.

10. The detector according to claim 9, wherein a material of the light guide is quartz.

11. The detector according to claim 9, wherein the light of gas scintillation is derived from nitrogen molecules.

12. The detector according to claim 9, wherein a voltage of the electrode and a gas pressure of the sample chamber are controlled by selection of an optimal condition table which is obtained in advance.

13. The detector according to claim 9, wherein shape of the electrode is a mesh-like pattern, a ring-like pattern, a plate-like pattern, or a multi-bar-like pattern.

14. The detector according to claim 9, wherein light from a side surface of the light guide is detected.

15. The detector according to claim 9, wherein the light guide is configured with a plurality of optical fibers.

16. The detector according to claim 9, wherein:
 the light guide is extended to bottom of an objective lens of the charged particle optical system, and
 the light guide is disposed above the sample.

* * * * *

UNITED STATES PATENT AND TRADEMARK OFFICE
CERTIFICATE OF CORRECTION

| | |
|---|---|
| PATENT NO. | : 8,692,195 B2 |
| APPLICATION NO. | : 13/633476 |
| DATED | : April 8, 2014 |
| INVENTOR(S) | : Ito et al. |

It is certified that error appears in the above-identified patent and that said Letters Patent is hereby corrected as shown below:

On the title page item "(63) Related U.S. Application Data", Data should read --Continuation of application No. 13/147,980 filed on August 4, 2011 now Pat. No. 8,294,097 which is a National Stage of PCT/JP2010/000279 filed Jan. 20, 2010-- rather than --Continuation of application No. 13/147,980, filed as application No. PCT/JP2010/000279 on Jan. 20, 2010, now Pat. No. 8,294,097.--

Signed and Sealed this
Twenty-fourth Day of June, 2014

Michelle K. Lee
*Deputy Director of the United States Patent and Trademark Office*